US006972439B1

United States Patent
Kim et al.

(10) Patent No.: US 6,972,439 B1
(45) Date of Patent: Dec. 6, 2005

(54) LIGHT EMITTING DIODE DEVICE

(75) Inventors: Hyung Suk Kim, Kyungki-do (KR); Young Sam Park, Seoul (KR); Hun Joo Hahm, Kyungki-do (KR); Jung Kyu Park, Kyungki-do (KR); Young June Jeong, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/916,525

(22) Filed: Aug. 12, 2004

(30) Foreign Application Priority Data

May 27, 2004 (KR) .................. 10-2004-0037763

(51) Int. Cl.[7] .................................... H01L 29/22
(52) U.S. Cl. .............................. 257/98; 257/100
(58) Field of Search ........................ 257/98, 99, 100, 257/81

(56) References Cited

U.S. PATENT DOCUMENTS 4,638,343 A * 1/1987 Althaus et al. ............... 257/98
6,674,096 B2 * 1/2004 Sommers ..................... 257/98
6,679,621 B2 1/2004 West et al.

FOREIGN PATENT DOCUMENTS

JP            9-330604      * 12/1997

* cited by examiner

Primary Examiner—Sara Crane
(74) Attorney, Agent, or Firm—Lowe Hauptman & Berner, LLP

(57) ABSTRACT

Disclosed herein is a light emitting diode (LED) device. The light emitting diode device comprises a package formed with a terminal for applying an electrical signal, one or more LED chips mounted on the package such that the LED chips are electrically connected to the terminal, a lens formed to surround the LED chips on the package for changing path of light emitted from the LED chips to the horizontal direction with the difference of the refraction rates of the media, and a reflector formed on the lens for reflecting the light, emitted above the lens without being refracted in the horizontal direction at the lens, to the horizontal direction. The LED device reflects the light, which is deviated from the optical design range of the lens and emitted above the lens, back to the lens, thereby preventing the hot spot from being generated, and enhancing horizontal emission efficiency of the light.

10 Claims, 4 Drawing Sheets

LIGHT EMITTING DIODE DEVICE

RELATED APPLICATIONS

The present application is based on, and claims priority from, Korean Application Number 2004-37763, filed May 27, 2004, the disclosure of which is hereby incorporated by reference herein in its entirety.

BACKGROUND OF THE INVENTION

1. Field of the Invention

The present invention relates to a light emitting diode device, which can be used for a light source of a backlight in a liquid crystal display (LCD), and more particularly to a light emitting diode device, which completely changes the path of light emitted upwardly at the center of the light emitting diode to the horizontal direction, thereby enhancing horizontal emission efficiency, together with preventing a hot spot.

2. Description of the Related Art

A light emitting diode (LED) is a semiconductor light emitting device, which emits various colors of light, with light sources being constituted by compound semiconductors made of various materials, such as GaAs, AlGaAs, GaN, InGaN and AlGaInP. Particularly, with the advent of highly efficient three primary colors (red, blue, green) and white LEDs realized by a nitride having excellent physical and chemical properties, the LEDs have more diverse applications, and thus have been spotlighted as a light source of a backlight for a liquid crystal display (LCD).

As a standard for determining characteristics of the LEDs, colors, brightness, intensity of light, and the like of the LEDs can be used, and these are determined primarily by the material of the compound semiconductor for the LEDs, and secondarily by a package structure for mounting LED chips.

Particularly, in the case of a horizontal emitting type LED device, which is used for a direct illumination type backlight unit, it is important to transmit the light generated from LED chips in the horizontal direction without light loss.

FIG. 1 is a cross sectional view illustrating a conventional horizontal emitting type LED device.

Referring to FIG. 1, the conventional horizontal emitting type LED device comprises a package 11 made of a plastic material and formed with a terminal 11a for inputting or outputting an electrical signal, an LED chip 14 mounted on the frame 11, and a lens 13 coupled to the frame 11 at the top surface of the frame 11 while being structured such that light generated from the LED chip 14 can be reflected to the horizontal direction.

The lens 13 is defined with a lower reflective surface A contacting the package 11, a first reflective surface B smoothly curved to have a semi-spherical shape from the lower reflective surface A, a second reflective surface C inclined outwardly from an upper portion of the first reflective surface B with reference to a central axis 10 of the lens 13, and a third reflective surface D inclined downwardly from the second reflective surface C to the central axis of the lens 10, in which the central axis 10 is established with reference to the LED chip 12.

The light emitted from the LED chip 12 collides against the reflective surfaces A to D defined as described above, is refracted, and then emitted.

The package 11 is provided for protecting the LED chip 12 from the external environment. The package is made of a plastic material, and structured such that the LED chip 12 can be protected from the external environment. The package 11 comprises a heat sink structure or means for dissipating heat generated when the LED chip 12 emits light, in addition to the terminal 11a for transmitting the electrical signal when being mounted thereon.

In the case where the horizontal emitting type LED device is used as the light source of the backlight, the backlight comprises an LED array provided as a linear light source by arranging the horizontal emitting type LED devices in a line on a predetermined printed circuit board, and a reflection plate provided at both sides of the LED array such that the light emitted in the horizontal direction is reflected to the perpendicular direction through the reflection plate.

Meanwhile, the conventional horizontal type light emitting diode device shown in FIG. 1 utilizes differences in the refraction rates of media, which the light passes through, that is, an LED chip 12, a lens 13, and air. For instance, the LED chip 12 is formed of a gallium-based compound with a refraction rate of about 2.4. The lens 13 is formed of a transparent or translucent resin with a refraction rate of about 1.5, and air has a refraction rate of 1. Accordingly, the light generated from the LED chip 12 sequentially passes through the media from the lower refraction rate to the higher refraction rate while being refracted or reflected according to an incident angle at the interface between the media.

Thus, the lens 13 is optically designed such that the light emitted from the LED chip 12 in any direction is refracted in the horizontal direction.

Meanwhile, in the light emitting diode device as described above, there sometimes occurs a problem in that a portion of the light incident at an angle deviated from an optical design range is emitted directly above the lens without being refracted at the reflective surfaces. Such a problem can become more apparent in the case where a large LED chip is mounted on the light emitting diode device, thereby further reducing horizontal emission efficiency of the light emitting diode device. In order to shield the light emitted in the perpendicular direction, structure of the lens 13 must become more complicated, thereby complicating the light emitting diode device.

Moreover, when the backlight unit of the LCD is realized using the light emitting diode device as described above, due to the light emitted in the perpendicular direction from the LCD device, there occurs a hot spot on a screen of the LCD. Accordingly, in order to prevent the hot spot, a separate sheet for preventing the hot spot is required for the backlight unit.

SUMMARY OF THE INVENTION

The present invention has been made in view of the above problems, and it is an object of the present invention to provide a light emitting diode device, which completely changes the path of light emitted upwardly at the center of the light emitting diode device to the horizontal direction, thereby enhancing horizontal emission efficiency together with preventing a hot spot.

In accordance with one aspect of the present invention, the above and other objects can be accomplished by the provision of a light emitting diode device, comprising: a package formed with a terminal for applying an electrical signal; one or more LED chips mounted on the package such that the LED chips are electrically connected to the terminal; a lens formed to surround the LED chips on the package for changing path of light emitted from the LED chips to the horizontal direction using the differences of refraction rates of the media; and a reflector formed on the lens for reflecting the light, emitted above the lens without being refracted in the horizontal direction by the lens, to the horizontal direction. The light emitting diode device completely shields the light emitted above the lens, and changes the path of light in the perfectly horizontal direction, thereby enhancing horizontal emission efficiency of the light, and absolutely preventing a hot spot from being generated when using the liquid emitting diode device for the backlight unit of the liquid crystal display.

The lens may be formed of a transparent or translucent resin. Further, the lens may comprise a first reflective surface inclined at an angle allowing total reflection of the light emitted upwardly from the LED chips, with reference to an axis extending in the perpendicular direction from the middle of the LED chips or from the center of the LED chip; and a second reflective surface extending from the first reflective surface to the top surface of the package at an angle refracting the light emitted from the LED chips approximately in the horizontal direction.

The reflector may be formed by applying a highly reflective metallic material to a bowl-shaped plastic base having a diameter larger than that of the lens.

Further, the lens may be formed at an upper portion of the lens with a concave groove and the reflector may be formed at a lower portion of the reflector with a protrusion, such that the groove and the protrusion correspond to each other, forming a pair, so that the lens can be engaged with the reflector by inserting the protrusion into the concave groove.

Further, the reflector may comprise: a third reflective surface defined at the bottom surface of the reflector contacting the lens for reflecting the light, passing through the first reflective surface without being totally reflected at the first reflective surface of the lens, below the reflector; and a fourth reflective surface obliquely defined from the third reflective surface for reflecting the light, emitted above the lens without being refracted at the second reflective surface of the lens in the horizontal direction, to the horizontal direction. The reflector may further comprises a fifth reflective surface defined at the top surface connected to the fourth reflective surface for reflecting the light, returned to the top surface of the reflector, above the light emitting device diode.

The light emitting diode device may be defined with an air gap having a predetermined shape surrounded by the first reflective surface of the lens and the reflector.

The light emitting diode device may be defined with a space having a predetermined shape surrounded by the first reflective surface of the lens and the reflector, and the space may be filled with a material having a refraction rate higher than that of the lens but lower than that of air.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now preferred embodiments of the present invention will be described in detail with reference to the accompanying drawings so that those skilled in the art may easily understand and repeat the present invention.

Figure 1:
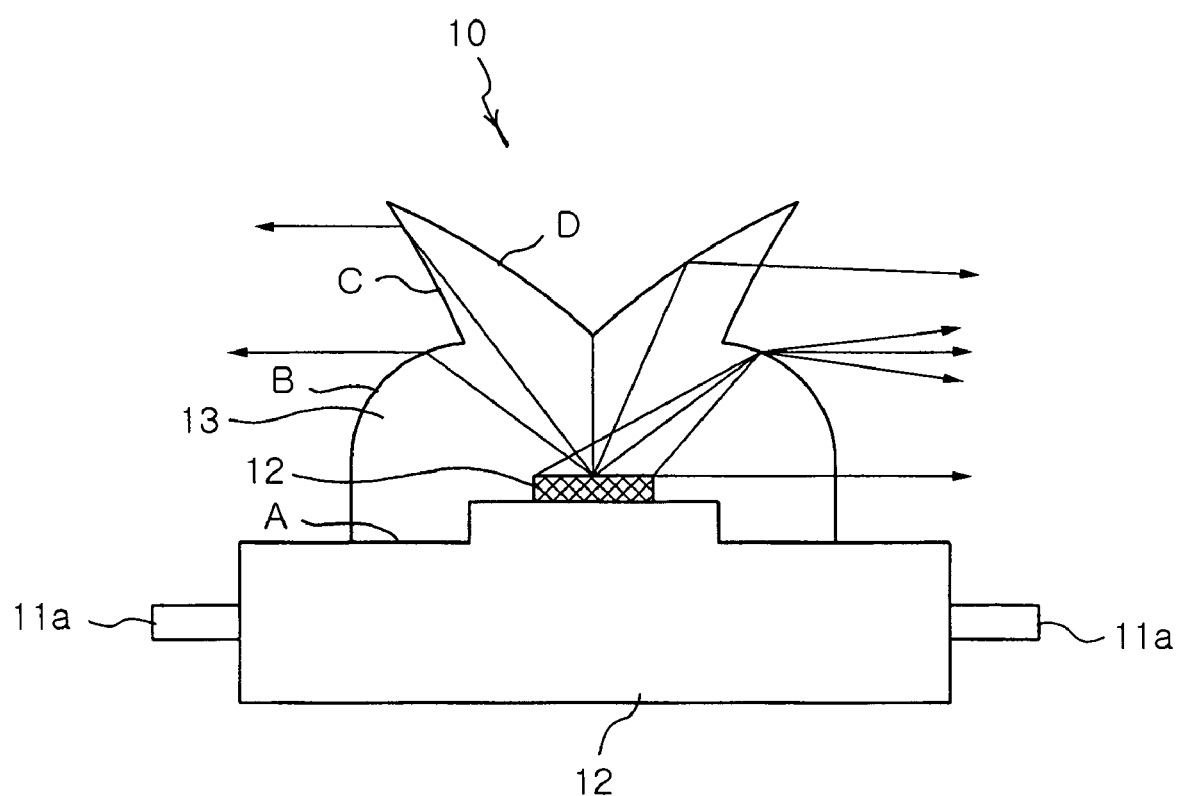
FIG. 1 is a cross sectional view illustrating a conventional light emitting diode device.
Figure 2:
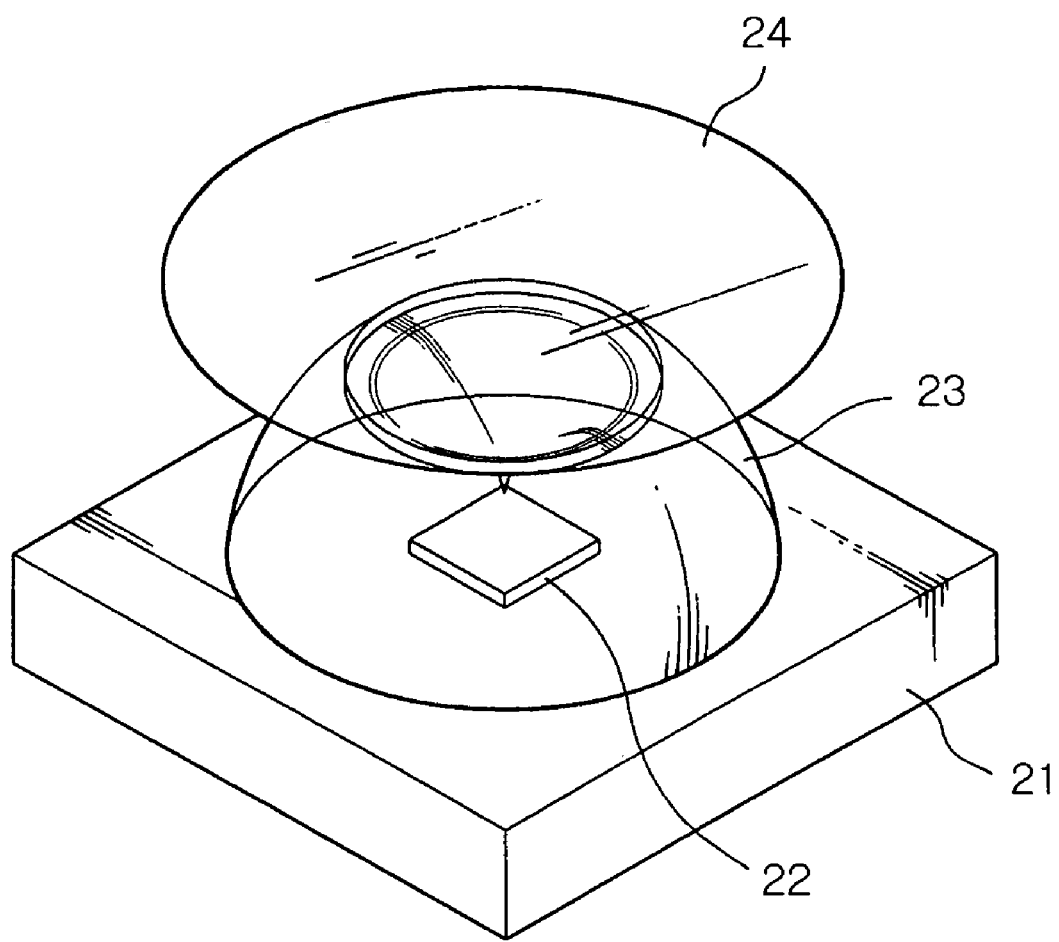
FIG. 2 is a cross sectional view illustrating a light emitting diode device according to the present invention.
Figure 3:
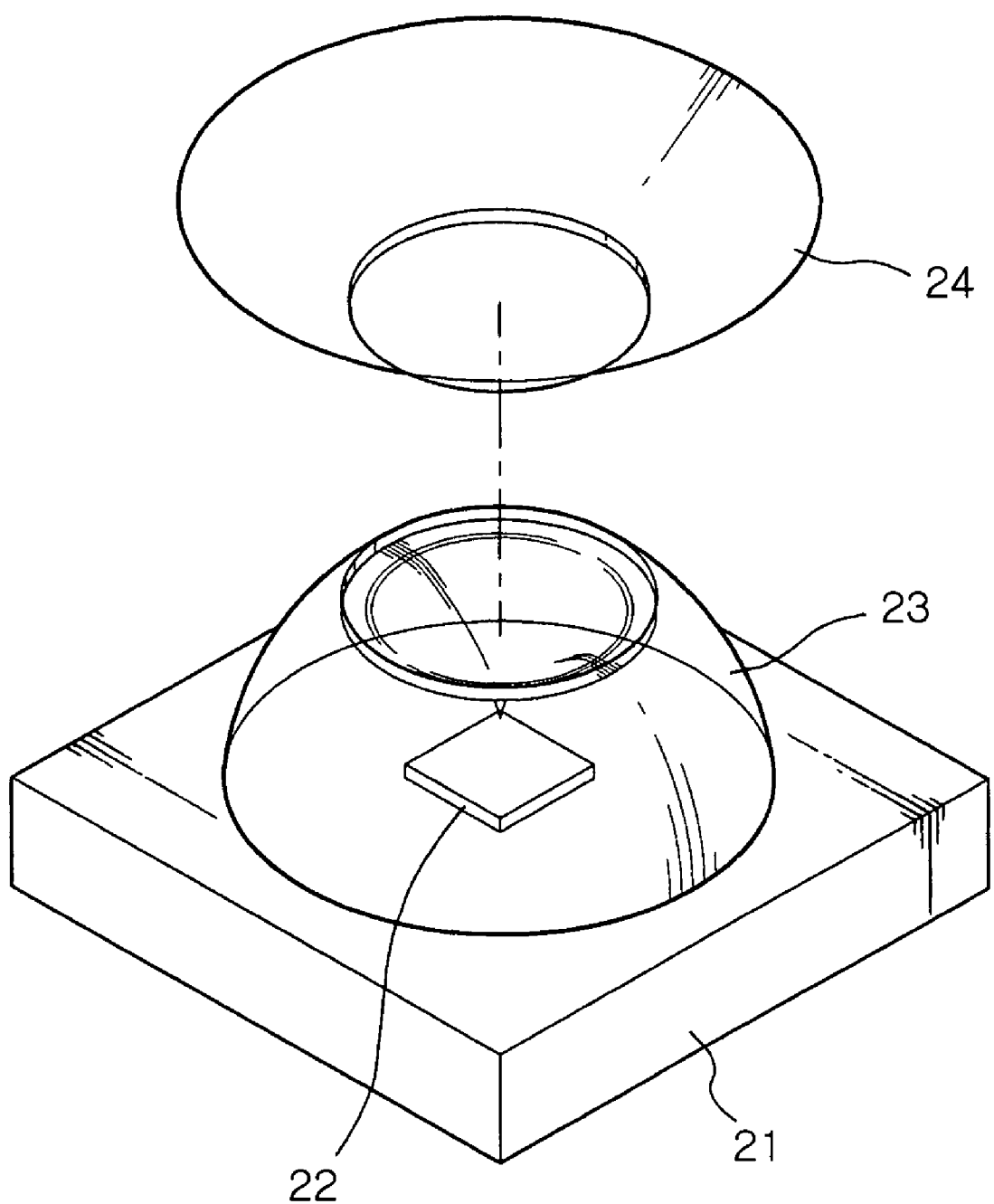
FIG. 3 is an exploded perspective view illustrating the light emitting diode device according to the present invention.

FIG. 2 is a cross sectional view illustrating a light emitting diode device according to the present invention, and FIG. 3 is an exploded perspective view illustrating the light emitting diode device according to the present invention.

Referring to FIGS. 2 and 3, a light emitting diode device comprises a package 21 formed with a terminal for applying an electrical signal, one or more LED chips 22 mounted on the package 21, a lens 23 formed to surround the LED chips at an upper portion of the package 21 for changing the path of light emitted from the LED chips 21 to the horizontal direction, and a reflector 24 for reflecting the light, emitted above the lens 23 without being refracted in the horizontal direction at the lens 23, to the horizontal direction.

First, the package 21 is structured such that the LED chips 22 can be protected from the external environment while being easily mounted thereon. The package 21 may be made of, for example, a plastic material, and may function to dissipate heat generated by the LED chips 22 as well as to electrically connect to other components at the outside. That is, the package 21 is formed with a lead frame or the terminal for electrically connecting to the other components at the outside thereof, and formed, at a portion to be mounted with the LED chips, with a heat sink made of a material having high thermal conductivity or having a structure of high thermal conductivity, which transmits the heat to a lower portion thereof. Moreover, the package 21 may be mounted with two or more LED chips 22, and in this case, the package 21 may comprise a board, with a printed circuit pattern for transmitting the electrical signal formed thereon, and the board may be made of aluminum in order to increase the heat dissipation characteristics.

The lens 23 is made of, for example, a transparent or translucent material having a refraction rate, which is lower than that of the LED chip 22 but higher than that of air, so that the light can be refracted at an interface between these materials in the horizontal direction due to the difference of the diffraction rate between adjacent media. That is, the lens 23 is optically designed such that the light emitted from the LED chips 22 in any direction can be refracted in the horizontal direction at the surface of the lens 23 contacting the air.

Figure 4:
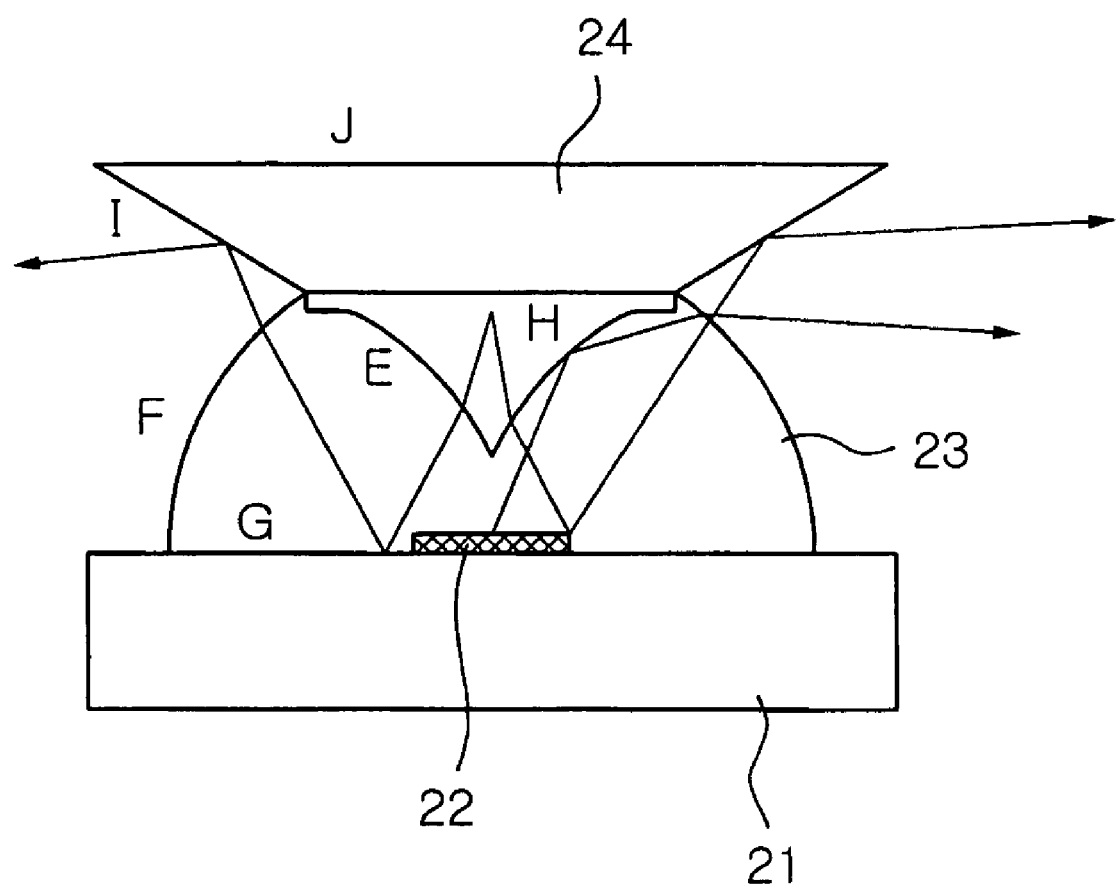
FIG. 4 is a diagram of the path of light in the light emitting diode device according to the present invention.

For instance, as shown in FIGS. 2 and 4, the lens 23 comprises: a first reflective surface E inclined such that the light emitted upwardly from the LED chips 22 can be incident thereon within a critical angle with reference to an axis extending in the perpendicular direction from the middle of the LED chips 22 or from the center of the LED chip 22; and a second reflective surface F extending from the first reflective surface to the top surface of the package at an angle, which refracts the light emitted from the LED chips 22, into the air, approximately in the horizontal direction.

The lens 23 is defined, at an upper portion thereof, with a concave groove having a cone-shape at the center of the groove by the first reflective surface.

The reflector 24 formed on the lens 23 may be formed by coating a highly reflective metallic material on the surface of a bowl-shaped base, which has a diameter larger than that of the lens 23.

The reflector 24 comprises: a third reflective surface H, defined at the bottom surface of the reflector 24 contacting the lens 23, for reflecting the light, passing through the first reflective surface without being totally reflected at the first reflective surface of the lens 23, below the reflector 24; and a fourth reflective surface I, obliquely defined from the third reflective surface, for reflecting the light, emitted above the lens without being refracted at the second reflective surface of the lens 23 in the horizontal direction, in the horizontal direction.

The reflector 24 further comprises a fifth reflective surface J, defined at the top surface connected to the fourth reflective surface I, for reflecting the light, returned to the top surface of the reflector 24, above the light emitting device diode.

As shown in FIG. 3, the lens 23 is formed at an upper portion thereof with a concave groove, and the reflector 24 is formed at a lower portion of the reflector 24 with a protrusion, such that the groove and the protrusion correspond to each other, forming a pair, so that the lens 23 can be engaged with the reflector 24 by inserting the protrusion into the concave groove. As a result, there is an effect in that assembly process of the lens and the reflector is simplified.

In the above structure of the lens and the reflector, the light emitted diode device is defined with a space surrounded by the first reflective surface of the lens 23 and the reflector 24. Alternatively, an air gap may be provided, instead of the space. The space may be filled with a material having a refraction rate, which is higher than that of the lens 23 but lower than that of the air.

FIG. 4 is a diagram showing the path of light in the light emitting diode device according to the present invention.

As shown in FIG. 4, the light, colliding against the second reflective surface F after being emitted from the LED chips 22, is refracted at the second reflective surface F, and is then emitted to the air in the horizontal direction. Further, the light, arriving at the first reflective surface E after being emitted from the LED chips 22, is bent toward the second reflective surface F while being totally reflected at the first reflective surface E, and is then emitted to the air in the horizontal direction after being refracted when passing through the second refractive surface F. At this point, the light, which is not incident on the first reflective surface E within the critical angle, passes through the first reflective surface E, and is emitted above the lens 23. However, the light is totally reflected at the third reflective surface H of the reflector 24 on the lens, so that the light is incident into the lens 23, and is refracted at the second reflective surface F, thereby being emitted to the air approximately in the horizontal direction. Here, among the light passing through the second reflective surface F of the lens 23, the light, emitted above the lens 23 without being refracted in the horizontal direction, is reflected while colliding against the fourth reflective surface I of the reflector 24, thereby having its path changed to the horizontal direction.

That is, the light is completely prevented from being emitted in the perpendicular direction in the light emitting diode device of the present invention, and all the light generated from the LED chip 22 can be directed in the horizontal direction, thereby completely preventing the hot spot from being generated.

Further, even though a portion of the light is deviated from the design range due to an increase in size of the LED chip 22 and is then not refracted at the lens 23 in the horizontal direction, the portion of the light can also be emitted in the absolutely horizontal direction, thereby enhancing horizontal emission efficiency of the device.

Additionally, the reflector 24 is provided with the fifth reflective surface J, which is formed by applying the highly reflective material on the top surface of the reflector 24, so that when the LED device is employed as the light source for the backlight unit of the liquid crystal display, the fifth reflective surface J also reflects the light, refracted to the top surface of the reflector 24 from the outside of the reflector, above the reflector 24, thereby providing uniform light emission efficiency over the entire screen of the liquid crystal display.

As is apparent from the above description, there are advantageous effects in that the LED device according to the present invention reflects the light, which is deviated from the optical design range of the lens and emitted above the lens, back to the lens, thereby preventing the hot spot from being generated. Further, the path of the light emitted above the lens is changed to the horizontal direction, thereby maximizing the horizontal emission efficiency of the LED device.

Moreover, when the LED device is used for the light source of the backlight unit, a separate sheet is not required for preventing the hot spot from being generated in the backlight unit, thereby simplifying the construction of the backlight unit, and enhancing uniform vertical light emission efficiency over the entire screen.

It should be understood that the embodiments and the accompanying drawings as described above have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A light emitting diode device, comprising:
   a package formed with a terminal for applying an electrical signal;
   one or more LED chips mounted on the package such that the LED chips are electrically connected to the terminal;
   a lens formed to surround the LED chips on the package for changing path of light emitted from the LED chips to the horizontal direction using differences of refraction rates of media; and
   a reflector formed on the lens for reflecting the light, emitted above the lens without being refracted in the horizontal direction at the lens, to the horizontal direction.

2. The light emitting diode device as set forth in claim 1, wherein the lens is formed of a transparent or translucent resin.

3. The light emitting diode device as set forth in claim 1, wherein the lens comprises: a first reflective surface inclined at an angle allowing total reflection of the light emitted upwardly from the LED chips, with reference to an axis extending in the perpendicular direction from the middle of the one or more LED chips or from the center of the LED chip; and a second reflective surface extending from the first reflective surface to the top surface of the package at an angle refracting the light emitted from the LED chips approximately to the horizontal direction.

4. The light emitting diode device as set forth in claim 1, wherein the reflector is formed by applying a highly reflective metallic material on a bowl-shaped plastic base having a diameter larger than that of the lens.

5. The light emitting diode device as set forth in claim 1, wherein the lens is formed at an upper portion of the lens with a concave groove, and the reflector is formed at a lower portion of the reflector with a protrusion, such that the groove and the protrusion correspond to each other, forming a pair, so that the lens can be engaged with the reflector by inserting the protrusion into the concave groove.

6. The light emitting diode device as set forth in claim 1, wherein the package is formed with a heat dissipation structure for dissipating heat generated from the LED chips.

7. The light emitting diode device as set forth in claim 3, wherein the reflector comprises: a third reflective surface defined at the bottom surface of the reflector contacting the lens for reflecting the light, passing through the first reflective surface without being totally reflected at the first reflective surface of the lens, below the reflector; and a fourth reflective surface obliquely defined from the third reflective surface for reflecting the light, emitted above the lens without being refracted at the second reflective surface of the lens in the horizontal direction, to the horizontal direction.

8. The light emitting diode device as set forth in claim 3, wherein the light emitting diode device is defined with an air gap having a predetermined shape surrounded by the first reflective surface of the lens and the reflector.

9. The light emitting diode device as set forth in claim 3, wherein the light emitting diode device is defined with a space having a predetermined shape surrounded by the first reflective surface of the lens and the reflector, and the space is filled with a material having a refraction rate higher than that of the lens but lower than that of air.

10. The light emitting diode device as set forth in claim 7, wherein the reflector further comprises a fifth reflective surface defined at the top surface connected to the fourth reflective surface for reflecting the light, returned to the top surface of the reflector, above the light emitting device diode.

* * * * *